United States Patent
Shin et al.

(10) Patent No.: US 9,171,780 B2
(45) Date of Patent: Oct. 27, 2015

(54) METHOD FOR MANUFACTURING SEMICONDUCTOR PACKAGE

(71) Applicant: SAMSUNG ELECTRO-MECHANICS CO., LTD., Suwon-Si (KR)

(72) Inventors: Yee Na Shin, Suwon-Si (KR); Young Nam Hwang, Suwon-Si (KR); Hyun Bok Kwon, Suwon-Si (KR); Seung Wan Woo, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/527,733

(22) Filed: Oct. 29, 2014

(65) Prior Publication Data

US 2015/0147849 A1 May 28, 2015

(30) Foreign Application Priority Data

Nov. 25, 2013 (KR) .................. 10-2013-0143761

(51) Int. Cl.
| | |
|---|---|
| *H01L 21/00* | (2006.01) |
| *H01L 23/48* | (2006.01) |
| *H01L 23/00* | (2006.01) |
| H01L 23/31 | (2006.01) |
| H01L 21/56 | (2006.01) |

(52) U.S. Cl.
CPC .............. *H01L 23/481* (2013.01); *H01L 24/27* (2013.01); *H01L 24/96* (2013.01); *H01L 21/561* (2013.01); *H01L 21/568* (2013.01); *H01L 23/3128* (2013.01); *H01L 2224/14* (2013.01)

(58) Field of Classification Search
CPC ....... H01L 24/11; H01L 23/481; H01L 21/56; H01L 21/78; H01L 29/7869; H01L 23/3142; H01L 23/552; H01L 24/14; H01L 24/49; H01L 24/81; H01L 25/117; H01L 25/50; H01L 2924/14; H01L 21/324
USPC ........... 257/676, E21.502, E21.499, E23.032; 438/108, 113, 118, 127
See application file for complete search history.

(56) References Cited

U.S. PATENT DOCUMENTS

| | | | |
|---|---|---|---|
| 6,246,117 B1 * | 6/2001 | Ichinose .................... 257/738 |
| 2010/0148340 A1 * | 6/2010 | Takano et al. ............... 257/686 |
| 2011/0111563 A1 * | 5/2011 | Yanagi et al. ............... 438/118 |

FOREIGN PATENT DOCUMENTS

WO     2009/035858 A2     3/2009

* cited by examiner

*Primary Examiner* — Mark A Laurenzi
(74) *Attorney, Agent, or Firm* — NSIP Law

(57) ABSTRACT

Disclosed herein is a method for manufacturing a semiconductor package. According to a preferred embodiment of the present invention, a method for manufacturing a semiconductor package includes: preparing a rectangular frame having a plurality of quadrangular holes; attaching a plurality of semiconductor chips and the frame on one surface of a tape; forming a molding part on the tape to cover the semiconductor chip and the frame; peeling the tape; forming a resin layer at a portion at which the tape is peeled; and forming a wiring on the resin layer to be connected to the semiconductor chip.

10 Claims, 2 Drawing Sheets

METHOD FOR MANUFACTURING SEMICONDUCTOR PACKAGE

CROSS REFERENCE TO RELATED APPLICATION

This application claims the benefit of Korean Patent Application No. 10-2013-0143761, filed on Nov. 25, 2013, entitled "Method For Manufacturing Semiconductor Package", which is hereby incorporated by reference in its entirety into this application.

BACKGROUND OF THE INVENTION

1. Technical Field

The present invention relates to a method for manufacturing a semiconductor package.

2. Description of the Related Art

To cope with the increase in demand for light, small, high-speed, multi-functional, and high-performance electronic products, a technology of packaging a semiconductor chip has been developed.

Generally, a semiconductor package is manufactured by first cutting a wafer along a scribe line to be separated into individual semiconductor chips and packaging the individual semiconductor chips.

Recently, a method for manufacturing the package by performing a packaging process in the wafer state without first cutting the wafer and then finally cutting the wafer along the scribe line has been proposed.

A wafer level package (WLP) or a semiconductor chip scale package (CSP) has been developed to provide another solution for a directly attached flip chip device.

A wafer level package (WLP) technology is a technology of implementing miniaturization, weight reduction, high performance, and the like.

An embedded type of wafer level package enables a manufacturing of the wafer level package having a fan-out form in which an external connection terminal may be disposed in a package larger than a size of the semiconductor chip.

PRIOR ART DOCUMENT

Patent Document (Patent Document 1) International Patent Laid-Open Publication No. WO 2009-035858

SUMMARY OF THE INVENTION

The present invention has been made in an effort to provide a method for improving pattern alignment and EMC molding flatness based on an epoxy molding compound (EMC) molding technology which enables a fan out wafer level package (fan out WLP) to have a substrate size to thereby mass-produce the fan out WLP.

Further, the present invention has been made in an effort to provide a method for encapsulating a plurality of semiconductor devices already separated and then separating the semiconductor devices into individual chips in a final process.

According to a preferred embodiment of the present invention, there is provided a method for manufacturing a semiconductor package, including: preparing a rectangular frame having a plurality of quadrangular holes; attaching a plurality of semiconductor chips and the frame on one surface of a tape; forming a molding part on the tape to cover the semiconductor chip and the frame; peeling the tape; forming a resin layer at a portion at which the tape is peeled; and forming a wiring on the resin layer to be connected to the semiconductor chip.

The method for manufacturing a semiconductor package may further include: prior to the peeling of the tape, curing the molding part.

The resin layer may be formed in a single layer or a multilayer.

The frame may be an epoxy molding compound (EMC).

In the attaching of the plurality of semiconductor chips and the frame on one surface of a tape, the semiconductor chips may be spaced from each other and thus may be attached within the quadrangular holes of the frame in a face-down type.

A cross section height of the frame may be larger than a thickness of the semiconductor chip.

The molding part may be an epoxy molding compound (EMC).

The method for manufacturing a semiconductor package may further include: after the forming of the molding part, curing the molding part to fix the semiconductor chip.

The frame and the molding part may have different colors.

The forming of the wiring may include: forming a via hole in the resin layer; and forming the wiring by plating and filling the via hole.

The method for manufacturing a semiconductor package may further include: after the forming of the wiring, forming a solder ball, which is an external connection terminal part, on the wiring.

The method for manufacturing a semiconductor package may further include: after the forming of the wiring, singulating the semiconductor package as individual semiconductor packages by a sawing process, wherein in the singulating of the semiconductor package, a dummy part between the frame and the individual semiconductor package is removed.

BRIEF DESCRIPTION OF THE DRAWINGS

The above and other objects, features and advantages of the present invention will be more clearly understood from the following detailed description taken in conjunction with the accompanying drawings, in which:

FIGS. 1 to 8 are process diagrams sequentially illustrating a method for manufacturing a semiconductor package according to a preferred embodiment of the present invention, in which FIG. 1 is a front view and FIGS. 2 to 8 are cross-sectional views.

DESCRIPTION OF THE PREFERRED EMBODIMENTS

Figure 1:
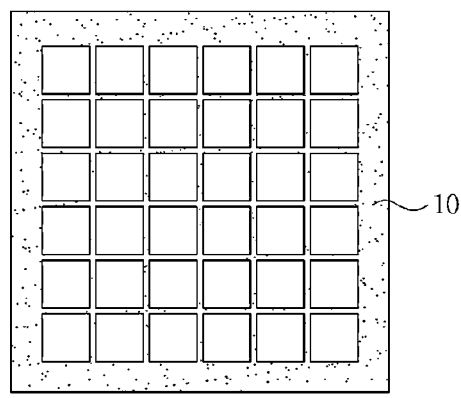

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Method for Manufacturing Semiconductor Package

FIGS. 1 to 8 are process diagrams sequentially illustrating a method for manufacturing a semiconductor package 100 according to a preferred embodiment of the present invention, in which FIG. 1 is a front view and FIGS. 2 to 8 are cross-sectional views.

Referring first to FIG. 1, FIG. 1 is a front view of a frame of the semiconductor package according to a preferred embodiment of the present invention.

A quadrangular frame 10 having a plurality of quadrangular holes is prepared.

In this case, the frame 10 may be manufactured at various sizes so as to easily mass-produced and may be used.

Further, the plurality of quadrangular holes may be manufactured at a proper size, and thus may be inserted with semiconductor chips 30 to be described below and a size of the quadrangular holes may also be changed depending on a size of the semiconductor chip 30.

In addition, the frame 10 according to the preferred embodiment of the present invention may be represented by a color different from a molding part 40 to easily be differentiated from the molding part 40 to be described below.

Herein, a material of the frame 10 may be an epoxy molding compound (EMC). However, according to the preferred embodiment of the present invention, the material of the frame is not limited thereto, and therefore any material to facilitate cutting in a sawing process may be used.

As described above, according to the method for manufacturing a wafer level semiconductor package, the cutting of the wafer level semiconductor package may be facilitated by using the above material when the semiconductor substrate is manufactured at a larger area like the general substrate, not at the existing wafer level size and then is finally singulated.

Further, when as the material of the frame 10, metal, ceramics, and a composite material thereof having high strength and excellent durability are used, characteristics of the frame 10 supporting the semiconductor chip 30 may be improved.

In addition, when a mark is formed in the frame 10 to improve the alignment of the semiconductor package 100, the semiconductor package 100 may suffer from segmentation correction and manufacturing completeness thereof may be increased.

Figure 2:
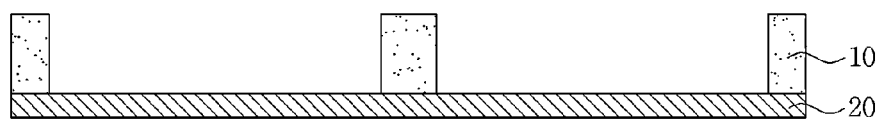
Figure 3:
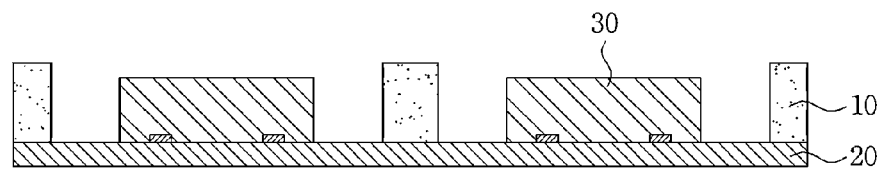

Next, referring to FIGS. 2 and 3, the plurality of semiconductor chips 30 and the frame 20 are attached on one surface of a tape 20.

The frame 10 and the semiconductor chips 30 are bonded on the one surface of the tape 20 by preparing the film-shaped tape 20 having a predetermined level of adhesion.

In this case, a cross section height of the frame 10 may be higher than that of the semiconductor chip 30.

Further, a thickness of the cross section of the frame 10 may be controlled as the designer demand.

In this case, the frame 10 formed with the mark is first bonded and then the semiconductor chip 30 is bonded, such that the frame 10 may be accurately bonded at positions at which the individual semiconductor chips 30 are bonded.

Herein, a connection pad of the semiconductor chip 30 is bonded with the tape 20 by a face-down type.

This is a manufacturing method to facilitate the manufacturing of the wafer level semiconductor package in a fan-out form, in which the connection pad of the semiconductor chip 30 bonded with the tape 20 is connected to a solder ball 70, which is an external connection terminal part, by a wiring 61 to be described below.

The above drawings do not illustrate in detail components of the semiconductor chip 30 and therefore schematically illustrate the components, but a person having ordinary skill in the art to which the present invention pertains may sufficiently recognize that the semiconductor chip 30 having all the known structures may be applied to the present invention without being particularly limited.

Figure 4:
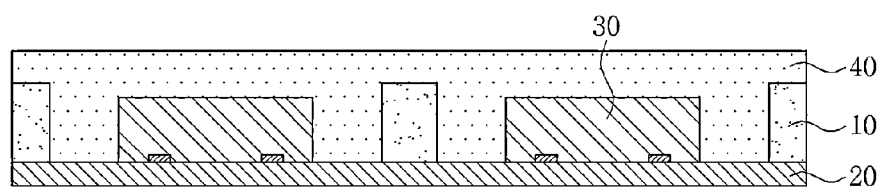

Next, referring to FIG. 4, the molding part 40 is formed on the tape 20 to cover the semiconductor chip 30 and the frame 10.

The molding part 40 is formed to be filled on the tape 20, and the molding part 40 is formed and then cured such that the semiconductor chip 30 may be well fixed.

Further, thermal insulation of the semiconductor chip 30 is effectively performed by forming the molding part 40.

In this case, as the material of the molding part 40, a silicon gel, an epoxy molding compound (EMC), and the like, may be used, but the preferred embodiment of the present invention is not limited thereto.

Figure 5:
Figure 6:
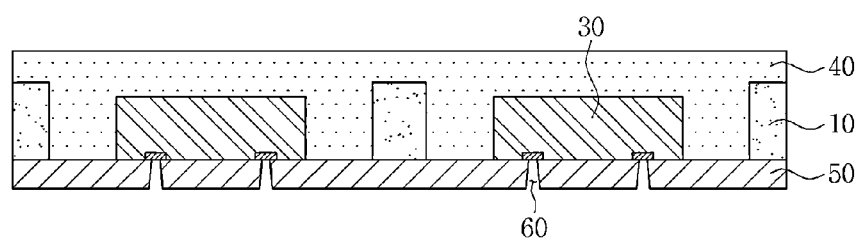
Figure 7:
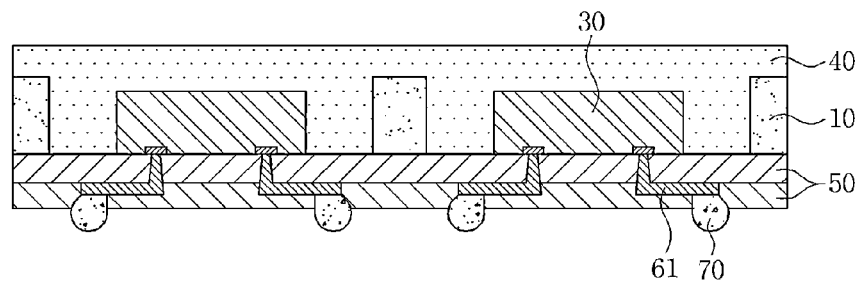

Next, referring to FIGS. 5 and 7, the tape 20 is peeled and then a portion from which the tape 20 is removed is provided with a resin layer 50.

In this case, the resin layer 50 may be formed in a single layer or a multilayer.

Herein, as a material of the resin layer 50, a photosensitive insulating material or a resin insulating layer may be used.

As a material of the resin insulating layer, a thermo-setting resin such as an epoxy resin, a thermo-plastic resin such as a polyimide resin, a resin having a reinforcement material such as a glass fiber or an inorganic filler impregnated in the thermo-setting resin and the thermo-plastic resin, for example, a prepreg may be used. In addition, a thermo-setting resin, a photo-curable resin, and the like, may be used. However, the material of the resin insulating layer is not particularly limited thereto.

Further, the formed resin layer 50 is formed with a via hole 60 so as to expose the connection pad of the semiconductor chip 30 and then is provided with the wiring 61 to be connected to the outside.

In this case, the wiring 61 is formed by forming the via hole 60 in the resin layer 50 and then plating and filling the via hole 60.

Herein, the method for forming a via hole 60 may be formed by being exposed and developed and may be formed by laser machining.

In this case, the laser machining preferably uses a CO2 laser, but in the preferred embodiment of the present invention, a kind of laser is not particularly limited.

Herein, the wiring 61 may be formed by plating and filling an inner wall of the via hole 60 with an insulating material by electroless plating and electroplating which are a general plating method.

Next, the solder ball which is the external connection terminal part is formed on the wiring 61.

Since the solder ball 70 is fixed by reflow but the contact reliability of solder tends to be reduced, some of the solder balls are buried in the insulating layer to strengthen a fixing force of the solder balls 70 and the rest thereof is exposed to the outside, thereby improving the reliability.

Figure 8:
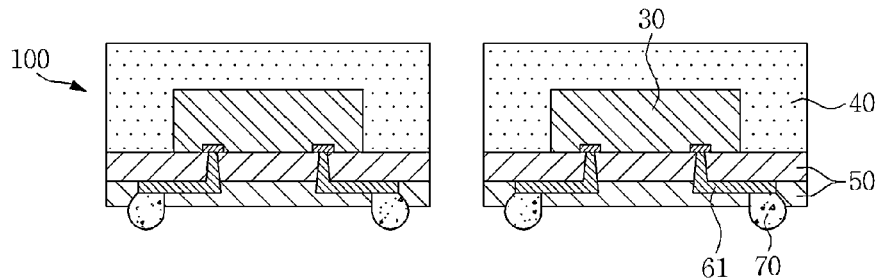

Finally, referring to FIG. 8, the semiconductor package is singulated as the individual semiconductor package 100 by the sawing process.

The semiconductor package 100 is formed by cutting the individual semiconductor chips 30 attached with the solder balls 70 by the connection with the wirings 61 based on the frame 10.

Herein, a dummy part between the frame 10 and the individual semiconductor package 100 is removed. In this case, the mark formed on the frame 10 and the material of the frame 10 are easy for the cutting.

Further, when the frame 10 is made of the epoxy molding compound (EMC), the frame 10 may be used without causing any problem in reliability even in the case in which the frame 10 is included in the unit semiconductor package 100.

Therefore, the individually formed semiconductor package 100 may also be made of a part of the frame 10 and the molding part 40 depending on the separation method and may be made of only the molding part 40.

According to the method for manufacturing a semiconductor package 100 according to the preferred embodiments of the present invention, it is possible to minimize the defect of products which may occur due to the handling problem at the time of performing the process by using the frame 10 serving as the supporter.

Further, according to the preferred embodiments of the present invention, it is possible to make the alignment between the semiconductor chips 30 excellent at the time of manufacturing the semiconductor package using the frame 10 formed with the mark used in the method for manufacturing a semiconductor package 100.

In addition, it is possible to efficiently mass-produce the semiconductor package by molding a large number of semiconductor chips 30 to have a larger area than that of the existing wafer level semiconductor package.

Moreover, since the frame 10 is made of the material similar to that of the molding part 40, the reliability of products is not affected even when the cut portion is not accurately removed at the time of performing the sawing process, such that the defects may be minimized and the manufacturing costs may be reduced.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A method for manufacturing a semiconductor package, comprising:
    preparing a rectangular frame of a material of a molding having a plurality of quadrangular holes;
    attaching a plurality of semiconductor chips and the frame on one surface of a tape;
    forming a molding part on the tape to cover the semiconductor chip and the frame;
    peeling the tape;
    forming a resin layer at a portion at which the tape is peeled;
    forming a wiring on the resin layer to be connected to the semiconductor chip; and
    singulating the semiconductor package as individual semiconductor packages by a sawing process.

2. The method as set forth in claim 1, wherein the resin layer is formed in a single layer or a multilayer.

3. The method as set forth in claim 1, wherein the frame is an epoxy molding compound (EMC).

4. The method as set forth in claim 1, wherein in the attaching of the plurality of semiconductor chips and the frame on one surface of a tape, the semiconductor chips are spaced from each other and thus are attached within the quadrangular holes of the frame in a face-down type.

5. The method as set forth in claim 1, wherein a cross section height of the frame is larger than a thickness of the semiconductor chip.

6. The method as set forth in claim 1, wherein the molding part is an epoxy molding compound (EMC).

7. The method as set forth in claim 1, further comprising:
    after the forming of the molding part, curing the molding part to fix the semiconductor chip.

8. The method as set forth in claim 1, wherein the forming of the wiring includes:
    forming a via hole in the resin layer; and
    forming the wiring by plating and filling the via hole.

9. The method as set forth in claim 1, further comprising:
    after the forming of the wiring, forming a solder ball, which is an external connection terminal part, on the wiring.

10. The method as set forth in claim 1,
    wherein in the singulating of the semiconductor package, a dummy part between the frame and the individual semiconductor package is removed.

* * * * *